(12) United States Patent
Wagner et al.

(10) Patent No.: US 8,941,955 B2
(45) Date of Patent: Jan. 27, 2015

(54) OVERVOLTAGE PREVENTION IN AN AIRCRAFT ELECTRICAL POWER GENERATION SYSTEM

(75) Inventors: Carl A. Wagner, Beloit, WI (US); John F. Defenbaugh, Rockford, IL (US); Vijay K. Maddali, Rockford, IL (US); Richard L. Young, Sycamore, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 872 days.

(21) Appl. No.: 13/171,787

(22) Filed: Jun. 29, 2011

(65) Prior Publication Data
US 2013/0003231 A1    Jan. 3, 2013

(51) Int. Cl.
H02H 7/06    (2006.01)
G01R 31/42    (2006.01)
G01R 19/165    (2006.01)
G01R 31/00    (2006.01)

(52) U.S. Cl.
CPC .............. H02H 7/06 (2013.01); *G01R 31/42* (2013.01); *G01R 19/16547* (2013.01); *G01R 31/008* (2013.01)
USPC .................................. 361/21; 361/1; 361/20

(58) Field of Classification Search
USPC ................................. 361/1, 20, 21
See application file for complete search history.

(56) References Cited

U.S. PATENT DOCUMENTS

| | | | |
|---|---|---|---|
| 4,777,376 A * | 10/1988 | Dishner | 290/4 R |
| 4,813,115 A * | 3/1989 | Fletcher et al. | 29/596 |
| 5,422,826 A * | 6/1995 | Cousineau | 700/287 |
| 5,495,381 A * | 2/1996 | Mrowiec et al. | 361/20 |
| 5,583,420 A | 12/1996 | Rice et al. | |
| 5,801,516 A | 9/1998 | Rice et al. | |
| 5,903,130 A | 5/1999 | Rice et al. | |
| 6,233,129 B1 | 5/2001 | Baumgartl et al. | |
| 6,731,486 B2 | 5/2004 | Holt et al. | |
| 6,850,043 B1 | 2/2005 | Maddali | |
| 7,224,144 B2 * | 5/2007 | Inokuchi et al. | 322/24 |
| 7,375,499 B2 | 5/2008 | Maddali et al. | |
| 7,436,287 B1 * | 10/2008 | Bollin | 340/309.16 |
| 7,453,240 B2 * | 11/2008 | Yamauchi et al. | 322/12 |
| 7,558,037 B1 | 7/2009 | Gong et al. | |
| 7,656,633 B2 | 2/2010 | Kilroy et al. | |
| 7,663,849 B2 * | 2/2010 | Shah et al. | 361/20 |
| 2008/0043383 A1 | 2/2008 | Shah et al. | |
| 2008/0238373 A1 | 10/2008 | Eldery et al. | |
| 2009/0192789 A1 * | 7/2009 | Lee et al. | 704/206 |
| 2012/0105022 A1 * | 5/2012 | Desabhatla et al. | 322/99 |
| 2012/0194948 A1 * | 8/2012 | Patel | 361/21 |
| 2012/0271525 A1 * | 10/2012 | Bucci et al. | 701/99 |
| 2013/0077201 A1 * | 3/2013 | Sagona | 361/91.1 |
| 2013/0182354 A1 * | 7/2013 | Maddali et al. | 361/21 |

FOREIGN PATENT DOCUMENTS

JP          2003324996 A * 11/2003 ............... H02P 9/14

* cited by examiner

*Primary Examiner* — Kawing Chan
(74) *Attorney, Agent, or Firm* — Carlson, Gaskey & Olds, P.C.

(57) ABSTRACT

An example method of detecting a generator overvoltage condition includes predicting a primary control current to provide a predicted control current, monitoring the primary control current, and detecting a generator overvoltage condition based on a comparison of the predicted control current to the primary control current. The method interrupts the primary control current based on the comparing.

17 Claims, 3 Drawing Sheets

OVERVOLTAGE PREVENTION IN AN AIRCRAFT ELECTRICAL POWER GENERATION SYSTEM

BACKGROUND

This disclosure relates to a power generating system. In particular, the disclosure relates to an overvoltage monitor and prevention configuration that is separate from a generator control unit of the power generating system.

One type of aircraft electrical power generating system includes a variable frequency generator. The variable frequency generator includes a permanent magnet generator (PMG), an exciter, and a main generator mounted for rotation on a common shaft. The shaft is driven by a prime mover.

A generator control unit (GCU) converts alternating current from the PMG to provide DC current to the exciter. Current from the exciter is fed to the main generator, which produces a voltage output.

Under some conditions, an overvoltage condition may result, which produces a higher than desired output voltage from the main generator. The main output of the generator main stator may be referred to as a primary current. There are many strategies for limiting or preventing overvoltage conditions, but desired overvoltage protection remains lacking. A typical overvoltage management strategy relies on the generator control unit to monitor power supplied by the main generator, and simply trip a switch to an open condition once an overvoltage threshold has been reached. In one example, manufacturing defects or environmental effects simultaneously disable the GCU and cause abnormally high generator output values. The disabled GCU is unable to detect or react to these high output values.

SUMMARY

An example method of detecting a generator overvoltage condition includes predicting a primary control current to provide a predicted control current, monitoring the primary control current, and detecting a generator overvoltage condition based on a comparison of the predicted control current to the primary control current. The method interrupts the primary control current based on the comparing.

Another example method of detecting a generator overvoltage condition in a generator coupled to a prime mover includes using an overvoltage prevention function calculation to provide a predicted control current. The predicted control current represents a prediction of the current supplied to a generator to generate a desired power. The method uses a voltage control function to provide a primary control current and detects a generator overvoltage condition by identifying a discrepancy between the predicted control current and the primary control current. The method interrupts the primary control current based on the identifying.

An example generator overvoltage control arrangement includes a permanent magnet generator, an exciter, and a main generator mounted for rotation on a shaft. The main generator is configured to produce a voltage output. A generator control unit includes a circuit configured to provide a primary control current from the permanent magnet generator to the exciter. An overvoltage prevention controller unit is programmed to determine an overvoltage of the output voltage using a comparison of a predicted control current to the primary control current.

BRIEF DESCRIPTION OF THE DRAWINGS

The various features and advantages of the disclosed examples will become apparent to those skilled in the art from the detailed description. The figures that accompany the detailed description can be briefly described as follows.

DETAILED DESCRIPTION

Figure 1:
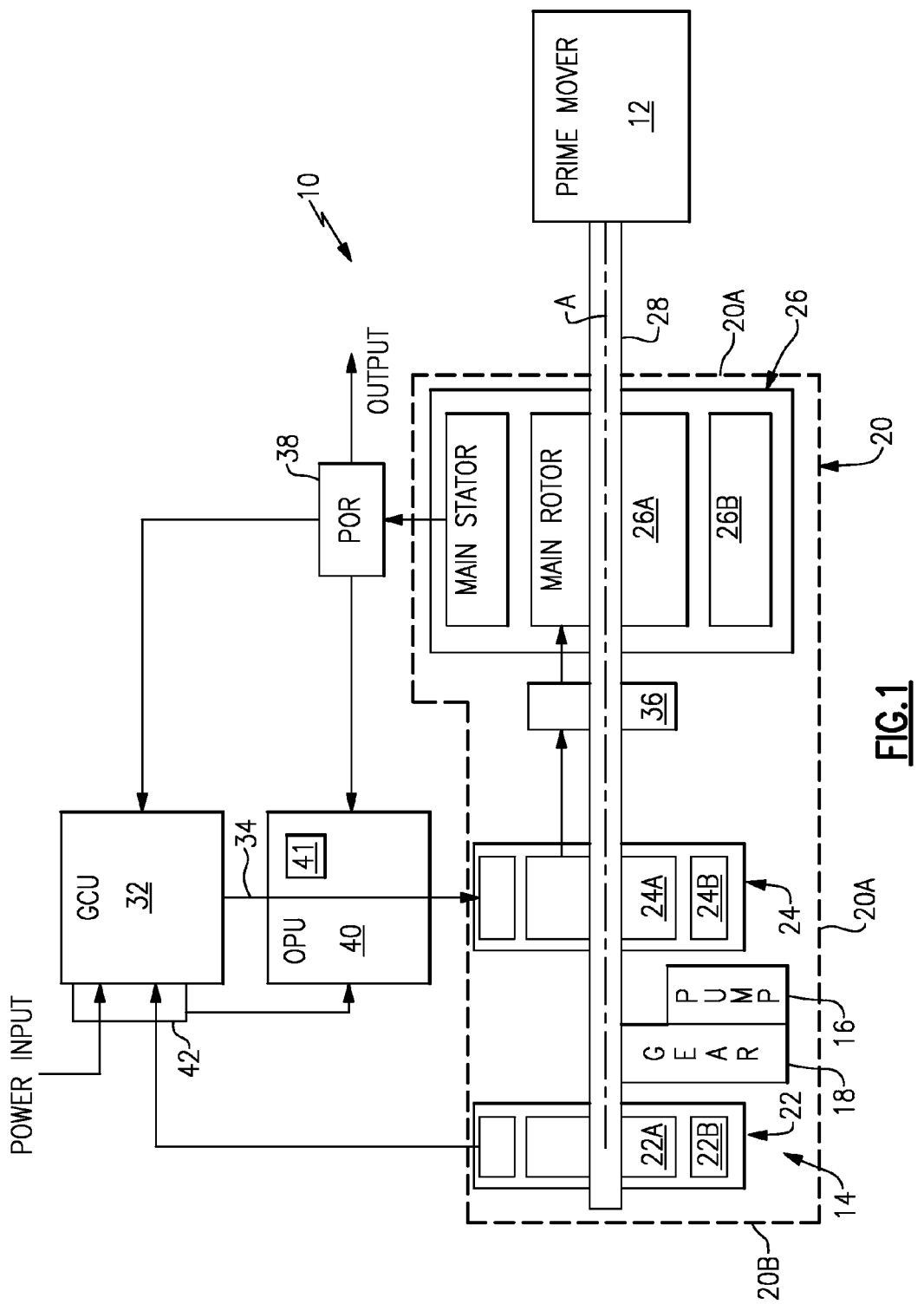
FIG. 1 is a general schematic sectional view of a generator for a gas turbine engine.

FIG. 1 schematically illustrates selected portions of an example generator 10 driven by a prime mover 12, such as a gas turbine engine. The generator 10 generates electrical current when driven by the prime mover 12. The generator 10 may generally include a dynamoelectric portion 14, a hydraulic pump 16, and a gear train 18, all contained within a common housing assembly 20.

The dynamoelectric portion 14 in the disclosed exemplary embodiment is a 3-phase machine that includes three machines 22, 24 and 26 mounted on a rotor shaft 28 along an axis of rotation A. Stator assemblies 22B, 24B, 26B of the three machines are installed in the housing assembly 20, and the three rotor assemblies 22A, 24A, 26A are installed on the rotor shaft 28. The housing assembly 20 may be closed with a drive end cover assembly or housing portion 20A, through which the rotor shaft 28 extends, and an end plate 20B.

The first machine 22 includes a permanent magnet generator (PMG) with a rotor assembly 22A and a stator assembly 22B. The stator assembly 22B supplies power for generator excitation, as well as power for other components of the electrical system. The second machine 24 includes an exciter with a rotor assembly 24A and a stator assembly 24B. The exciter receives field excitation from the PMG through a GCU 32 (Generator Control Unit). The field excitation moves along a path 34 from the GCU 32 to the exciter. The field excitation moving along the path 34 is considered the primary control current in this example. The GCU 32 implements a voltage control function to provide the primary control current.

The output of the rotor assembly 24A is supplied to a shaft mounted diode pack 36. The diode pack 36 may be divided into six diode groups to provide a 3-phase full wave bridge rectification. The DC output of the diode pack 36 supplies the third machine 26, or main generator, which provides a desired output voltage from a POR 38 (Point of Regulation). The GCU 32 receives point of regulation (POR) voltage from the POR 38 and, in response, provides the primary control current along path 34 to achieve the desired output voltage from the generator 10.

In this example, an OPU 40 (overvoltage prevention unit, also referred to as an overvoltage prevention controller unit) is configured to monitor the primary control current moving along the path 34. The example OPU 40 is separate from the GCU 32 and is outside the housing assembly 20. In some examples, the GCU 32 includes its own internal overvoltage protection system to implement an overvoltage protection function independent of an overvoltage prevention function implemented by the OPU 40.

The OPU 40 includes a processing module 41 that compares a measurement of the primary control current moving along the path 34 to a prediction of the primary control current. The OPU 40 bases the prediction of the primary control current on the same conditions and inputs that the GCU 32 uses to generate the primary control current. The OPU 40 may communicate with a sensor 42 to determine at least some of the information used to generate the prediction of the primary control current.

The OPU 40 is configured to detect a generator overvoltage condition based on a comparison of the primary control current moving along the path 34 to the predicted control current calculated by the OPU 40. For example, the OPU 40 may be programmed to interpret a sustained discrepancy between the primary control current and the predicted control current as a potential generator overvoltage condition. A sustained discrepancy is a discrepancy that lasts for more than a millisecond, for example. In some examples, the OPU 40 interrupts the primary control current if an overvoltage is detected.

The example OPU 40 is independent from the GCU 32 and the generator 10. Accordingly, the OPU 40 is not affected by failures of the GCU 32. Examples of such failures include manufacturing defects, electrical wiring faults, part failures, and environmental conditions that may cause an overvoltage condition and simultaneously disable any overvoltage protection function incorporated into the GCU 32.

Figure 2:
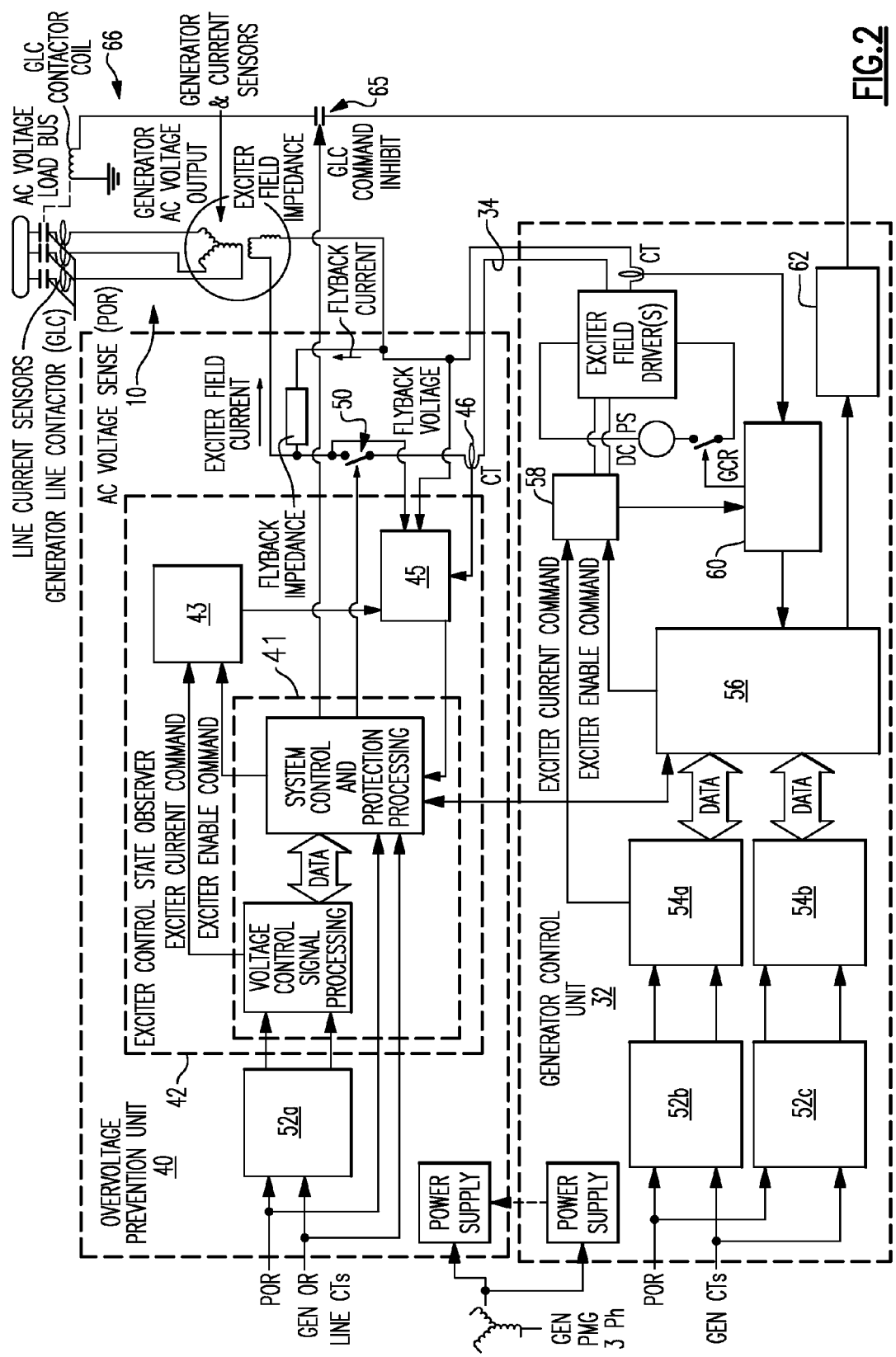
FIG. 2 is a more detailed schematic view an overvoltage prevention arrangement for the FIG. 1 generator.

Portions of the OPU 40 and the GCU 32 are illustrated in more detail in FIG. 2. As shown, the OPU 40 includes an exciter control state observer portion 42 having the processing module 41, an exciter driver compilation module 43, and an excitation command difference module 45. The processing module 41 may receive status information and health monitoring information from the generator 10. The exciter control state observer portion 42 may include analog/comparator-type circuits, field programmable gate arrays, digital signal processors, or some combination of these.

In this example, the excitation command difference module 45 of the OPU 40 monitors the real time status of the primary exciter current command moving along the path 34 using a sensor 46. The monitoring may include measuring conditions, such as a level of the current command, a rate of change of the current command, a direction of change of the current command, a modulation of the current command or some combination of these.

The conditions detected by the sensor 46 are then compared to a prediction of what those conditions should be. The comparison takes place in the excitation command difference module 45. In one example, a transfer function, or another type of overvoltage prevention function calculation, is used to determine the predicted conditions.

The predicted conditions are based on the same inputs that are used by the GCU 32. Example inputs include a speed of the generator 10, a driver current or field of the machine 24, a magnitude of the AC generator and load current, and an AC voltage at the point of regulation. A person having skill in this art and the benefit of this disclosure would understand how to provide these inputs to the OPU 40.

In this example, a switch 50 is positioned in the path 34. The switch 50 can be transitioned or modulated between open and closed conditions. The example switch 50 is shown in the open condition. The primary control current flows along the path 34 in the closed condition, and primary control current flow is interrupted in the open condition. The processing module 41 is electrically connected to the switch 50 and receives signals from the excitation command difference module 45. The processing module 41 is configured to modulate the switch 50 between the open and closed conditions according to a detected overvoltage.

In this example, when the switch 50 is opened (when it is modulated, etc.), the reverse voltage observed across the flyback impedance is high (e.g., more than 1.2 times a typical value), and there is a sensed flyback current. A flyback voltage sensing transformer may sense the flyback voltage and current. Other examples may include direct contact differential sensing of the flyback voltage and current.

The example GCU 32 and OPU 40 include scaling and filtering portions 52a-52c. The input scaling and filtering portion 52a of the OPU 40 scales and filters the current, which is then provided to the processing module 41. The input scaling and filtering portions 52b and 52c of the GCU 32 provide scaled and filtered current to processing modules 54a and 54b, respectively. A microprocessor 56 of the GCU 32 receives data from the modules 54a and 54b. The GCU 32 also includes drivers 58, monitors 60, relays 62, etc. uses to adjust and refine the primary control current 34. Again, the OPU 40 utilizes information from the GCU 32, and particularly the microprocessor 56, when determining the predicted control current.

In this example, a switch or relay 65 removes excess generator voltage from the generator 10 by opening a generator line contactor 66. This arrangement of removing excess generator voltage provides redundant function to the switch 50.

Figure 3:
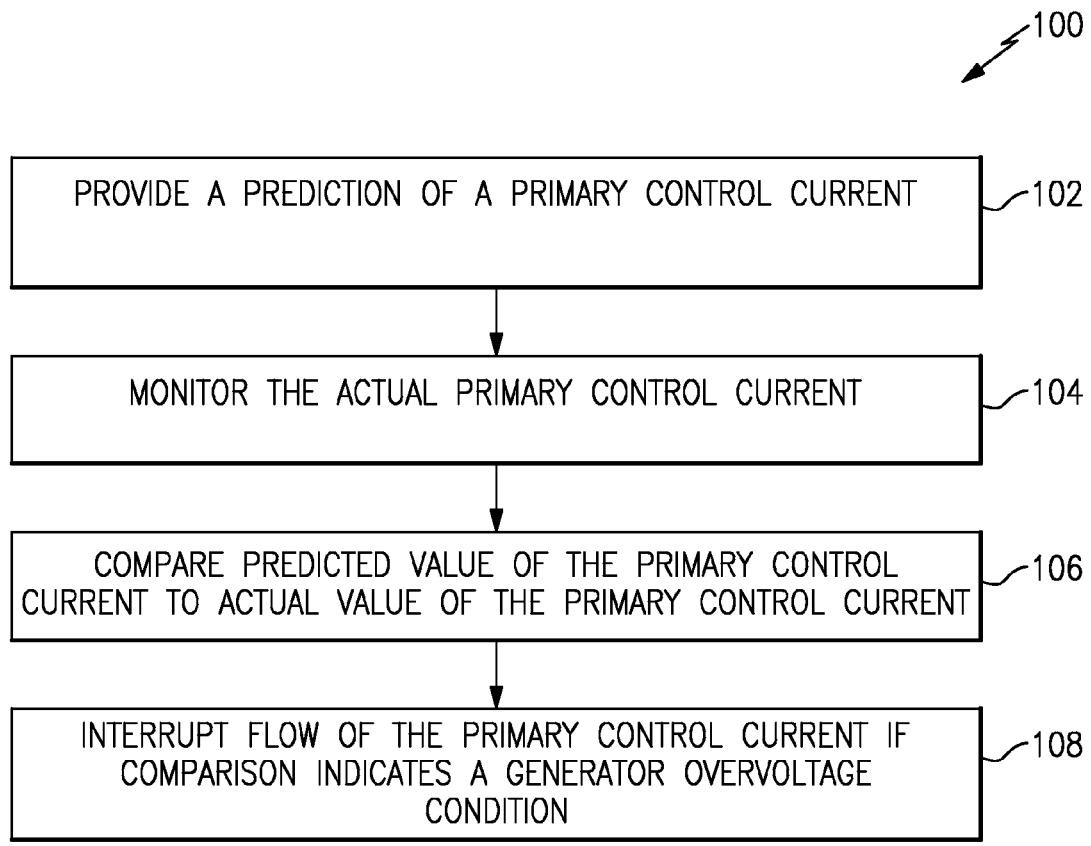
FIG. 3 shows the flow of an example method of preventing overvoltage of the FIG. 1 generator.

Referring to FIG. 3 with continuing reference to FIGS. 1 and 2, a method of identifying overvoltage of the generator 10 is generally indicated at 100. At a step 102, the method 100 provides a predicted control current. In this example, the predicted control current represents a prediction of a primary control current that should be supplied along the path 34 to the generator 10 to cause the generator 10 to produce a desired output.

The method 100 also monitors the primary control current that is actually supplied to the generator 10 at a step 104, and then, at a step 106, detects a generator overvoltage condition based on a comparison of the predicted primary control current from the step 104 to the actual current detected at the step 106. The flow of the primary control current along the path 34 is interrupted at a step 108 if the comparison in the step 106 indicates a generator overvoltage condition.

In this example, the method 100 is executed as part of start-up procedure of the generator 10. Thus, the generator 10 is checked for a generator overvoltage condition each time the generator 10 is started. This approach ensures that a generator overvoltage condition is identified before the generator 10 begins communicating power to a load bus and other equipment on the aircraft.

In one example, the method 100 may include a capability to self-test. For example, during a start-up procedure of the generator, the GCU 32 may be configured to deliberately exhibit conditions representing known failure modes, such as commanding drivers in the GCU 32 to appear shorted, and then monitoring the OPU 40 for a proper response. An example of a proper response should be for the OPU 40 to disable the actual current moving to the generator 10 along the path 34. An output voltage from the generator 10 should also exhibit a rapid decay.

In another example, excitation power is inhibited and the actual current is shut down by a common mode effects conditions that could influence multiple normal control elements and cause overexcitation conditions.

Regarding the step 108, inverse time delay curves may be used to define the notional levels and times that are assumed for setting the GCU and OPU maximum delay.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

We claim:

1. A method of detecting a generator overvoltage condition comprising:
   predicting a primary control current to provide a predicted control current;
   monitoring the primary control current;
   detecting a generator overvoltage condition based on a comparison of the predicted control current to the primary control current; and
   interrupting the primary control current based on the comparing.

2. The method of claim 1, wherein the predicting uses a speed of the generator, a current of an exciter, or a combination of the speed of the generator and the current of the exciter.

3. The method of claim 1, wherein the predicting uses a magnitude of a load current, a magnitude of a generator current, or both.

4. The method of claim 1, wherein the predicting uses a voltage at a point of regulation.

5. The method of claim 1, wherein the monitoring comprises a real-time monitoring of the primary exciter current command.

6. The method of claim 5, wherein the monitoring comprises monitoring a level, a rate of change, a direction of change, a modulation waveform, or a combination of the level, the rate of change, the direction of change, and the modulation waveform.

7. The method of claim 1, wherein the detecting comprises identifying a discrepancy between the primary control current and the predicted control current.

8. A method of detecting a generator overvoltage condition in a generator coupled to a prime mover comprising:
   using an overvoltage prevention function calculation to provide a predicted control current, the predicted control current representing a prediction of the current supplied to the generator to generate a desired power;
   using a voltage control function to provide a primary control current;
   detecting a generator overvoltage condition by identifying a discrepancy between the predicted control current and the primary control current; and
   interrupting the primary control current based on the identifying.

9. The method of claim 8, wherein the overvoltage prevention function calculation is independent from the voltage control function and an overvoltage protection function.

10. The method of claim 8, wherein the generator is a variable or regulated frequency generator.

11. The method of claim 8, wherein a start-up procedure of the generator includes verifying the ability of providing the predicted control current and of providing the primary control current.

12. A generator overvoltage control arrangement comprising:
   a permanent magnet generator, an exciter, and a main generator mounted for rotation on a shaft, the main generator configured to produce a voltage output;
   a generator control unit including a circuit configured to provide a primary control current from the permanent magnet generator to the exciter; and
   an overvoltage prevention controller unit programmed to determine an overvoltage of the output voltage using a comparison of a predicted control current to the primary control current.

13. The generator overvoltage control arrangement of claim 12, including a switch provided in the overvoltage prevention controller unit configured to change between open and closed conditions, the switch configured to flow the primary control current in the circuit in the closed condition and interrupt current flow in the open condition, wherein the overvoltage prevention controller unit is configured to modulate the switch between the open and closed conditions according to a detected overvoltage.

14. The generator overvoltage control arrangement of claim 13, wherein the switch is separate from the generator control unit.

15. The generator overvoltage control arrangement of claim 13, wherein the switch in the open condition causes connection of a flyback impedance in a path of the primary control current to reduce the output voltage.

16. The generator overvoltage control arrangement of claim 12, wherein the overvoltage prevention controller unit is configured to monitor a speed of the generator, a current of an exciter, or a combination of the speed of the generator and the current of the exciter to determine the predicted control current.

17. The generator overvoltage control arrangement of claim 12, wherein the generator control unit is separate from the overvoltage prevention controller unit.

* * * * *